United States Patent [19]

Angerer et al.

[11] Patent Number: 4,604,594

[45] Date of Patent: Aug. 5, 1986

[54] SURFACE WAVE FILTER HAVING PHOTORESIST DAMPING MATERIAL THEREON AND METHOD FOR MANUFACTURING THE SAME

[75] Inventors: Heinrich Angerer; Badri Sinha, both of Munich, Fed. Rep. of Germany

[73] Assignee: Siemens Aktiengesellschaft, Berlin and Munich, Fed. Rep. of Germany

[21] Appl. No.: 532,721

[22] Filed: Sep. 15, 1983

[30] Foreign Application Priority Data

Sep. 21, 1982 [DE] Fed. Rep. of Germany ....... 3234955

[51] Int. Cl.$^4$ ..................... H03H 9/145; H03H 9/25
[52] U.S. Cl. .................................... 333/194; 333/151; 310/313 R; 310/326; 29/25.35
[58] Field of Search ............... 333/194, 195, 193, 151, 333/150, 153, 154; 310/313 R, 313 B, 313 C, 313 D, 326, 327; 29/25.35

[56] References Cited

U.S. PATENT DOCUMENTS

| | | | |
|---|---|---|---|
| 4,139,791 | 2/1979 | Yamada et al. | 310/313 C |
| 4,354,129 | 10/1982 | Ieki | 310/313 B X |
| 4,426,595 | 1/1984 | Kawaura et al. | 333/194 X |
| 4,470,026 | 9/1984 | Buckinx et al. | 333/194 |
| 4,486,724 | 12/1984 | Schofield | 333/194 |
| 4,511,866 | 4/1985 | Milsom | 333/154 X |

FOREIGN PATENT DOCUMENTS 0158724 12/1980 Japan ..................................... 333/193

OTHER PUBLICATIONS

Anderson, A. C., et al.; "Attenuating Thin Films for SAW Devices"; 1980 *Ultrasonics Symposium Proceedings;* Boston, Mass., Nov. 5-7, 1980.

Primary Examiner—Eugene R. LaRoche
Assistant Examiner—Benny Lee
Attorney, Agent, or Firm—Herbert L. Lerner; Laurence A. Greenberg

[57] ABSTRACT

A surface wave filter with a wafer-shaped substrate formed of monocrystalline piezoelectric material having a surface, input and output transducers disposed on the surface of the substrate, a coupler for coupling the transducers being spaced apart from the transducers on the surface of the substrate defining zones therebetween, and electric conductor runs being connected to the transducers on the surface of the substrate and having ends, includes a damping layer formed of photoresist material with a plastic base covering substantially the entire surface of the substrate except for a region bounded by the transducers, the coupler, the ends of the electric conductor runs and the zones between the transducers and the coupler, and a method for manufacturing the filter.

11 Claims, 4 Drawing Figures

SURFACE WAVE FILTER HAVING PHOTORESIST DAMPING MATERIAL THEREON AND METHOD FOR MANUFACTURING THE SAME

The invention relates to a surface wave filter with a slab or wafer-shaped substrate of monocrystalline piezoelectric material, particularly lithium niobate; a damping compound and input and output transducers and possibly a coupler for coupling the transducers to each other, each being disposed on one surface of the substrate.

To fabricate such filters, a metal layer is usually vapor-deposited on the substrate. The transducers, couplers and conductor runs together with their ends are developed from the metal layer by means of a photo-etching technique. The substrate patterned in this way is cemented on to a metal support sheet and the ends of the conductor leads are electrically connected by bonding wires to the contact legs of the filter. The system is then inserted into a plastic housing and filled with casting compound.

If electrical signals are fed to the input transducer, it emits surface waves at the same frequency but in different directions. The coupler picks up a part of the surface waves and specifically the part directed toward the coupler and also passes on the part of the surface waves in the direction toward the output transducer which converts the surface waves back into electrical signals. Reflected waves, are especially generated at the severed edges of the substrates, and are also caused by crystal structural faults. The reflected waves are therefore time-delayed and partially suppressed by certain technical means. For this purpose, a damping compound consisting, for instance, of a heat sealing adhesive, is melted on the surface between the end faces of the substrate and the transducers. However, only a relatively small area parallel to the severed edges of the chip area can be damped by this process. Undesirable reflections of waves, which have an interfering effect on the reception of the surface waves by the transducers and the coupler which are all attached to the substrate, are therefore unavoidable in spite of the use of these damping compounds.

It is accordingly an object of the invention to provide a surface wave filter and method of manufacturing the same, which overcomes the hereinbefore-mentioned disadvantages of the heretofore-known devices of this general type, and which permits nearly complete damping or suppression of the interfering reflected waves.

With the foregoing and other objects in view there is provided, in accordance with the invention, a surface wave filter with a wafer-shaped substrate formed of monocrystalline piezoelectric material having a surface, input and output transducers disposed on the surface of the substrate, and optionally a coupler for coupling the transducers, the couplers being spaced apart from the transducers on the surface of the substrate defining zones therebetween, and electric conductor leads being connected to the transducers on the surface of the substrate and having electrodes, comprising a damping layer formed of photoresist material with a plastic base covering substantially the entire surface of the substrate except for a region bounded by the transducers, the coupler, the electrodes of the electric conductor leads and the zones between the transducers and the coupler.

This nearly complete covering of the free areas by means of a damping layer, ensures that not only can the reflections occurring at the severed edges of the substrate be suppressed but also that the reflections which are caused by the most varied crystal structure faults in the substrate can be suppressed as well.

In accordance with the invention, the dampening layer is applied by means of a well known photolithographic method as a layer formed of photoresist material with a plastic base over substantially the entire surface of the substrate except for a region bounded by the transducers, the electrodes of the electric conductor leads and the zones between the transducers. By means of this method it is possible to deposit the damping layer with accuracy in regard to position, so that the area of the chip surface which is free of the damping layer can be limited to a minimum. If this method is already applied in the processing of the wafers, i.e., in the processing of the substrate wafer which is divided into numerous chips but not yet mechanically separated, a considerable cost-saving in production is attained. Resists with a plastic base i.e. negative and positive photo resists are applied to the substrate with a layer thickness of preferably more than 10 $\mu$m.

In accordance with an additional feature of the invention, the substrate is formed of lithium niobate.

In accordance with a concomitant mode of the invention there is provided a method which comprises omitting the damping layer over the coupler and the zones between the transducers and the coupler.

Other features which are considered as characteristic for the invention are set forth in the appended claims.

Although the invention is illustrated and described herein as embodied in a surface wave filter and method for manufacturing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
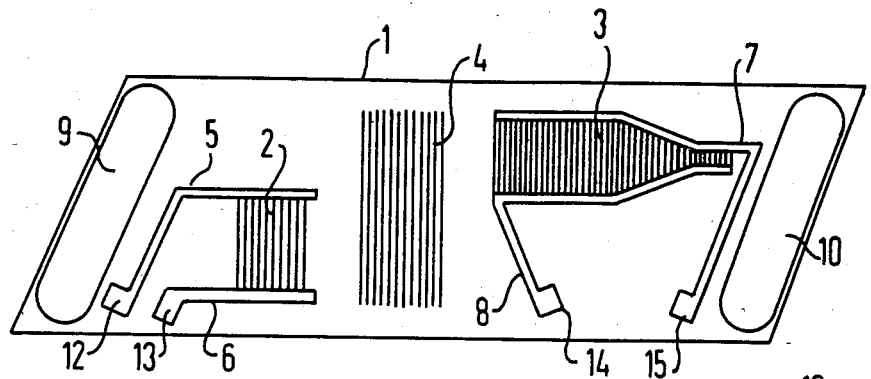
FIG. 1 is a diagrammatic top plan view of a prior art surface wave filter.
Figure 2:
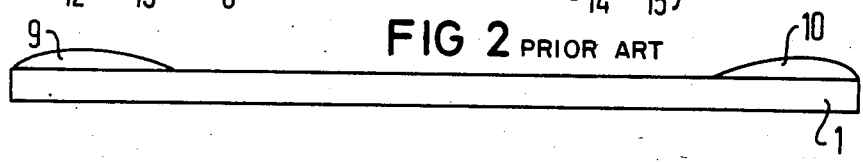
FIG. 2 is a side elevational view of FIG. 1.

Referring now to the figures of the drawings in detail and first particularly to FIGS. 1 and 2 thereof, there is seen a substrate 1 on which transducers 2, 3, a strip-shaped coupler 4 and conductor leads 5 through 8 having electrodes 12 through 15, are disposed. a damping compound which may be in the form of a heat sealing adhesive is melted on the surface of the substrate 1 in areas 9, 10 between the ends of the substrate 1 and the transducers 2,3. As can be seen, this process provides a relatively small area parallel to the edges of the substrate 1 which can be damped. This damping process avoids the occurrence of undesirable wave reflections which interface with the transducers 2, 3 and the coupler 4.

Figure 3:
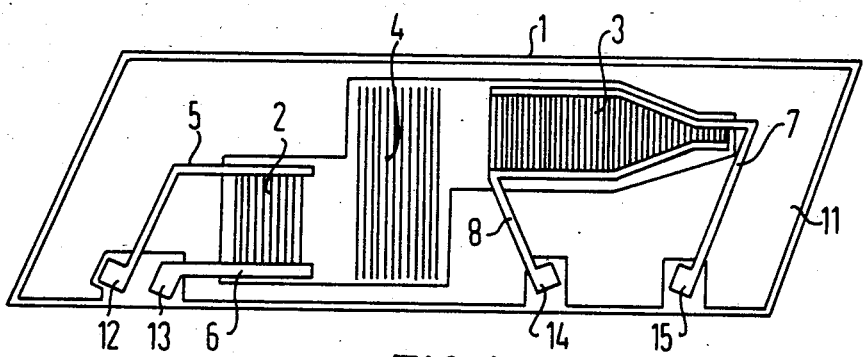
FIG. 3 is a top plan view of the surface wave filter according to the invention.
Figure 4:
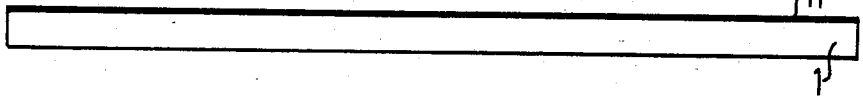
FIG. 4 is a side elevational view of FIG. 3.

FIGS. 3 and 4 illustrate a device and method according to the invention, for improving the damping. In FIGS. 3 and 4, the input and output transducers 2 and 3, the strip-shaped coupler 4 and the conductor leads 5, 6, 7 and 8 with their electrodes 12, 13, 15, 14, respectively, are designated with the same reference symbols as in FIGS. 1 and 2. The transducers are formed of interdigitated electrodes, as is conventional. According to the invention, a photoresist layer 11 with a plastic base covers the entire substrate surface except for the outlined area which is bounded by the transducers 2 and 3, the coupler 4, the electrodes (12, 13, 14, 15) of the electric conductor leads (5, 6, 7, 8) and the zones between the transducers (2, 3) and the coupler 4. The substrate may be a wafer or slab-shaped body of monocrystalline piezoelectric material, such as lithium niobate. The layer 11 may be formed of negative or positive photoresist material and be applied by photolithographic methods.

The foregoing is a description corresponding in substance to German Application No. P 32 34 95.6, dated Sept. 21, 1982, the International priority of which is being claimed for the instant application, and which is hereby made part of this application. Any material discrepancies between the foregoing specification and the aforementioned corresponding German application are to be resolved in favor of the latter.

We claim:

1. In a surface wave filter with a wafer-shaped substrate formed of monocrystalline piezoelectric material having a surface, input and output transducers disposed on the surface of the substrate, a coupler for coupling the transducers, said coupler being spaced apart from the transducers on the surface of the substrate, and electric conductor leads being connected to the transducers on the surface of the substrate and having respective electrodes, the improvement comprising a damping layer formed of photoresist material having a plastic base covering substantially the entire surface of the perimeter of the substrate except for a region bounded by the perimeter of the transducers, the coupler, the respective electrodes of the electric conductor leads and the zones between the transducers and the coupler.

2. In a surface wave filter with a wafer-shaped substrate formed of monocrystalline piezoelectric material having a surface, input and output transducers disposed on the surface of the substrate and defining zones therebetween, and electric conductor leads being connected to the transducers on the surface of the substrate and having respective electrodes, the improvement comprising a damping layer formed of photoresist material having a plastic base covering substantially the entire surface of the substrate except for a region bounded by the transducers, the respective electrodes of the electric conductor leads and the zones between the transducers.

3. Surface wave filter according to claim 1, wherein said damping layer is formed of a positive photoresist material.

4. Surface wave filter according to claim 2, wherein said damping layer is formed of a positive photoresist material.

5. Surface wave filter according to claim 1, wherein said damping layer is formed of a negative photoresist material.

6. Surface wave filter according to claim 2, wherein said damping layer is formed of a negative photoresist material.

7. Surface wave filter according to claim 1, wherein the substrate is formed of lithium niobate.

8. Surface wave filter according to claim 2, wherein the substrate is formed of lithium niobate.

9. Method for manufacturing a surface wave filter including a wafer-shaped substrate having a surface, input and output transducers disposed on the surface of the substrate and electric conductor leads being connected to the transducers on the surface of the substrate and having respective electrodes, said method comprised of: photolithographically applying a damping layer formed of photoresist material having a plastic base over substantially the entire surface of the substrate except for a region bounded by the perimeter of the transducers, the respective electrodes of the electric conductor leads and the zones between the transducers.

10. Method according to claim 9, which comprises providing the damping layer in the form of a negative photoresist material.

11. Method according to claim 9, which comprises providing the damping layer in the form of a positive photoresist material.

* * * * *